(12) United States Patent
Sakaki

(10) Patent No.: US 8,273,656 B2
(45) Date of Patent: Sep. 25, 2012

(54) METHOD OF FORMING CONDUCTIVE LAYER AND SEMICONDUCTOR DEVICE

(75) Inventor: Takashi Sakaki, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/438,786

(22) Filed: Apr. 3, 2012

(65) Prior Publication Data

US 2012/0189781 A1   Jul. 26, 2012

Related U.S. Application Data

(62) Division of application No. 12/634,619, filed on Dec. 9, 2009, now Pat. No. 8,173,542.

(30) Foreign Application Priority Data

Dec. 26, 2008   (JP) .................................. 2008-333866

(51) Int. Cl.
*H01L 23/52* (2006.01)
(52) U.S. Cl. ................. 438/652; 438/687; 257/E23.141
(58) Field of Classification Search .................. 257/774, 257/E23.141, E21.585; 438/652, 687
See application file for complete search history.

(56) References Cited

U.S. PATENT DOCUMENTS

| 5,145,552 | A | 9/1992 | Yoshizawa et al. |
| 5,323,535 | A | 6/1994 | Sakaki et al. |
| 5,379,515 | A | 1/1995 | Kondo et al. |
| 5,521,520 | A | 5/1996 | Yoshizawa et al. |
| 5,606,263 | A | 2/1997 | Yoshizawa et al. |
| 6,015,081 | A | 1/2000 | Okabayashi et al. |
| 6,268,619 | B1 * | 7/2001 | Kosaki et al. ............. 257/276 |
| 8,173,542 | B2 * | 5/2012 | Sakaki ............. 438/652 |
| 2004/0262165 | A1 | 12/2004 | Kanda et al. |
| 2006/0270228 | A1 * | 11/2006 | Lee et al. ............. 438/687 |

* cited by examiner

*Primary Examiner* — Roy Potter
(74) *Attorney, Agent, or Firm* — Fitzpatrick, Cella, Harper & Scinto

(57) ABSTRACT

Provided are a method of forming a conductive layer on an inner portion of a through-electrode in which uniform adhesion property of plating in the inner portion of a through-hole is enhanced and a tact time is short, and a semiconductor device. The method of forming a conductive layer includes: a first plating step of forming a first plating layer on the inner portion of the through-hole; a plating suppression layer forming step of forming a plating suppression layer including a material different from a material of the first plating layer in an opening portion of the through-hole after the first plating step; and a second plating step of forming a second plating layer by plating on the inner portion of the through-hole after the plating suppression layer forming step.

9 Claims, 6 Drawing Sheets

METHOD OF FORMING CONDUCTIVE LAYER AND SEMICONDUCTOR DEVICE

This application is a division of U.S. application Ser. No. 12/634,619, filed Dec. 9, 2009 (allowed), the contents of which are incorporated herein by reference.

BACKGROUND OF THE INVENTION

1. Field of the Invention

The present invention relates to a method of forming a conductive layer involving a step of forming by plating a conductive layer on an inner portion of a through-hole formed in a substrate, and a semiconductor device.

2. Description of the Related Art

Hitherto, there have been proposed various methods of forming a conductive layer on an inner portion of a through-hole (hereinafter, both a hole having an opening on one side and a hole having openings on both sides are referred to as a through-hole) formed in a substrate made of an insulating material or a substrate with an insulated surface.

By connecting a front surface to a back surface of a substrate electrically via the conductive layer formed on an inner portion of a through-hole, for example, the conductive layer is used as a through-electrode for substrate stacking. As a method of forming a conductive plating is mostly used.

In a through-hole, in particular, a through-hole with a large aspect ratio (hole depth/opening diameter), a conductive layer is likely to adhere to the vicinity of an opening of the through-hole, and the opening is closed before the conductive layer is sufficiently formed by plating on a bottom of the through-hole, with the result that the film thickness of the conductive layer on the bottom of the through-hole becomes small. Therefore, there arises a problem such that electricity is hard to flow through the conductive layer in a portion where the film thickness is small.

In order to solve the above-mentioned problem, there are known a method regarding a plating liquid that uses an accelerator or an inhibitor, and a method regarding a plating current control of slowly starting a plating current value and changing the plating current value in two stages.

As one method regarding a plating liquid, there is provided a method of adding an additive such as polyethylene glycol a plating liquid. This method prevents the opening from being closed by allowing a resin component of polyethylene glycol to be adsorbed to a portion in which an electric field is concentrated in the vicinity of the opening, thereby suppressing plating in the vicinity of the opening.

Furthermore, as one method regarding a plating current control, there is known a method in which, when a through-hole with a large aspect ratio is plated, the inner portion of the through-hole is plated at a current density smaller than that at a time of plating a flat surface. Thus, the plating liquid exchange ratio in the through-hole is enhanced with respect to a plating growth rate, and the adhesion property of plating on the bottom of the through-hole is enhanced (U.S. Patent Application Publication No. 2004/026216511).

However, the conventional methods have the following problems.

In the method using an additive, in the case of using a gold plating liquid that contains gold as metal, which most stable and desirable in electrical reliability regarding a resistance and chemical reliability regarding a corrosion, there arise the following problems. First, a gold cyanide plating liquid that is a cyanide bath and is a generally used gold plating liquid is very stable solution, and hence, the effect of the additive is hardly obtained, and the opening is closed before a plating adheres completely to the bottom of the through-hole. Furthermore, the liquid state of a non-cyanide bath is very unstable, and the balance of ph or the like is likely to be lost. Thus a decrease in precipitation efficiency, locally abnormal precipitation, and a plating defect such as burning may occur. Furthermore, the plating liquid life of the non-cyanide bath is remarkably short, and hence, the non-cyanide bath is not practical use.

In the method regarding a plating current control, when plating is performed at a recommended current density (i.e., $1/10$ or less), the plating can be performed without closing the opening. However, the current density is small, and hence it takes a long period of time (i.e., 2 hours), which is a remarkably limiting condition as a tact at a time of mass-production. Hence, the method cannot be adopted. When plating is performed at a current density of about twice the value described above (i.e., $1/5$) in order to set a tact time to be one hour which is a half of 2 hours, an electric field is concentrated in the opening portion, and the opening is closed before plating is completed to the bottom of the through-hole.

SUMMARY OF THE INVENTION

The present invention has been accomplished to solve the above-mentioned problems of the related art, and it is, therefore, an object of the present invention to provide a method of forming a conductive layer on an inner portion of a through-hole in which uniform adhesion property of plating in the inner portion of the through-hole is enhanced and a tact time is short, and a semiconductor device.

In order to achieve the above-mentioned object, according to the present invention, there is provided a method of forming a conductive layer involving a step of forming by plating a conductive layer on an inner portion a through-hole formed in a substrate, the method including; a first plating step of forming a first plating layer on the inner portion of the through-hole, a plating suppression layer forming step of forming a plating suppression layer having an electric conductivity lower than an electric conductivity of the first plating layer in an opening portion of the through-hole after the first plating step, and a second plating step of forming a second plating layer by plating on the inner portion of the through-hole after the plating suppression layer forming step.

Furthermore, according to the present invention, there is provided a semiconductor device having a conductive layer formed on an inner portion of a through-hole formed in a substrate, which includes a first plating layer formed in an opening portion of the through-hole, a plating suppression layer formed on the first plating layer, and a second plating layer formed on the first plating layer and the plating suppression layer.

According to the present invention, the conductive layer can be formed with high efficiency even on the bottom of the through-hole.

Further features of the present invention will become apparent from the following description of exemplary embodiments with reference to the attached drawings.

DESCRIPTION OF THE EMBODIMENTS

First Embodiment

Hereinafter, a method of forming a conductive layer according to the present invention is described with reference to the drawings.

FIGS. 2 to 10 each illustrate the method of forming a conductive layer according to a first embodiment of the present invention, which are schematic cross-sectional views of midstream of a main process.

(Step of Forming a Through-Hole)

Figure 2:
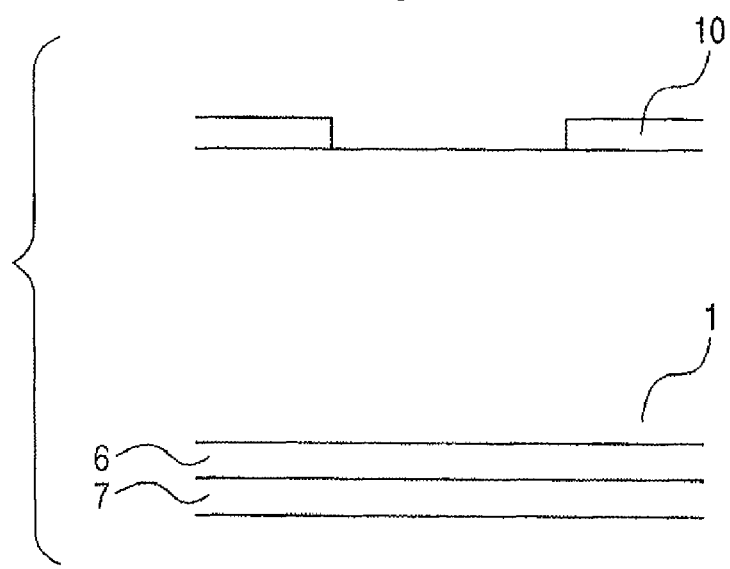
FIG. 2 is a schematic cross-sectional view illustrating a method of forming a conductive layer according to the first embodiment of the present invention.

First, a semiconductor substrate 1 as illustrated in FIG. 2 is prepared. As the semiconductor substrate 1, for example, a substrate with a thickness of about 200 μm can be used, which contains as a main component a single element such as silicon, germanium, or selenium, or a compound such as an oxide, a sulfide, a selenide, a telluride, an antimonid, an arsenide, or a phosphide. On the surface of the semiconductor substrate 1 (surface of a silicon thermal oxide film 6 in the case where the silicon thermal oxide film 6 is formed on the semiconductor substrate 1), an electrode pad 7 previously formed on the semiconductor substrate surface is provided. Furthermore, a semiconductor element (not shown) may be provided via wiring on the electrode pad 7. Furthermore, a support member (not shown) may be formed on the electrode pad 7 via a resin layer. The support member may be removed in the subsequent step or left without being removed. A through-hole penetrating the semiconductor substrate 1 is formed from the back surface side of the semiconductor substrate 1 at a position corresponding to the electrode pad 7 on the semiconductor substrate 1 to form a through-hole in the semiconductor substrate 1, and the electrode pad 7 is exposed on a bottom of the through-hole. In order to form the through-hole, a resist 10 is first applied, and an opening shape of the through-hole is patterned by photolithography.

Figure 3:
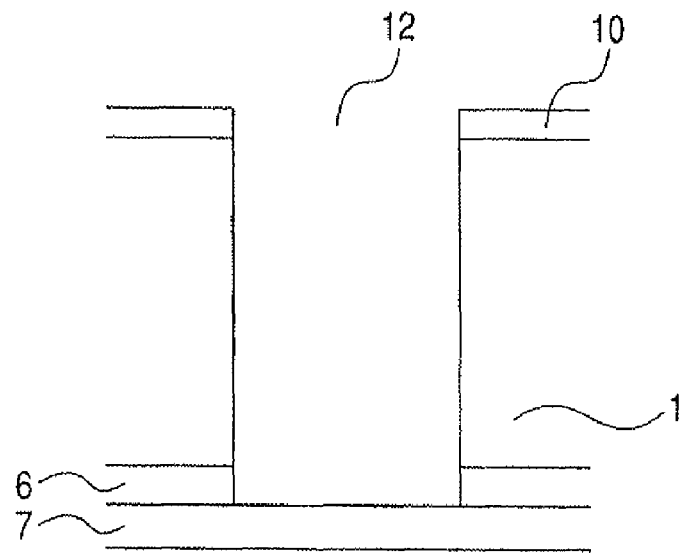
FIG. 3 is a schematic cross-sectional view illustrating the method of forming a conductive layer according to the first embodiment of the present invention.

Next, as illustrated in FIG. 3, a through-hole 12 is formed to have an opening. As a method of forming a hole, for example, inductively coupled plasma reactive ion etching (ICP-RIE) can be used. Thus, for example, a through-hole 12 with an opening diameter of Φ50 μm is formed. After the through-hole 12 is formed, the resist 10 is removed.

(Step of Forming an Insulating Layer)

Figure 4:
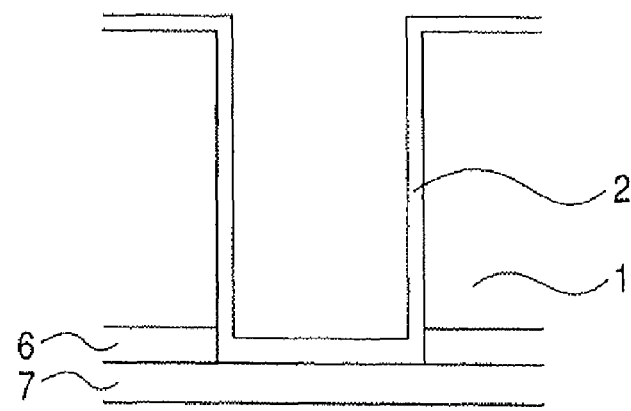
FIG. 4 is a schematic cross-sectional view illustrating the method of forming a conductive layer according to the first embodiment of the present invention.

Next, as illustrated in FIG. 4, an insulating layer 2 is formed on an inner portion of the opening of the through-hole 12. The insulating layer 2 is also formed on the back surface of the semiconductor substrate 1. The insulating layer 2 may be an organic insulating film formed by parylene film formation. The parylene film thickness may be about 1 μm to 3 μm. According to the parylene film formation, an insulating layer can be formed more uniformly when selecting a condition of film formation over a long period, of time while the supply of gas of a film formation material does not become excess in the through-hole 2 in a reaction chamber at a low pressure. As the insulating layer, in addition to par ylene, various kinds of resins such as a polyimide resin, a maleimide resin, a polyamide resin, a polyimideamide resin, a polyester resin, a polyether resin, a bisphenol resin, a modified epoxy resin, a modified acrylic resin, a silicon resin, a fluororesin, and a melamine resin, or a resin obtained by combining those resins appropriately can be used.

(Bottom Etching Step)

Figure 5:
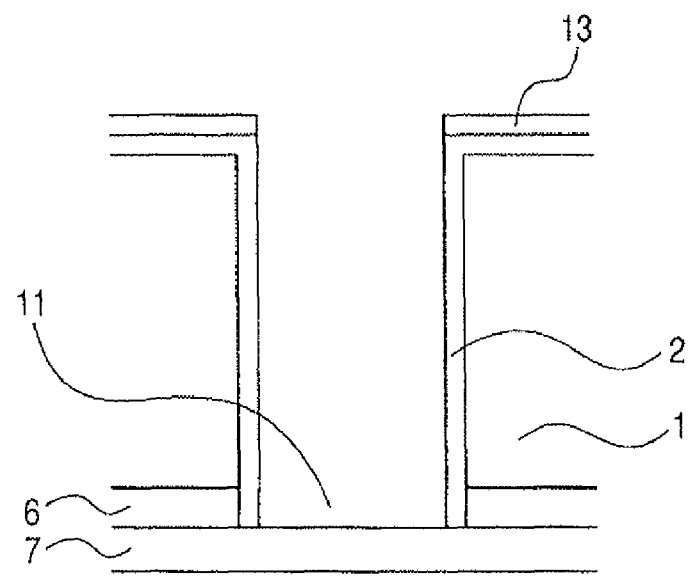
FIG. 5 is a schematic cross-sectional view illustrating the method of forming a conductive layer according to the first embodiment, of the present invention.

Next, as illustrated in FIG. 5, in order to connect the through-hole 12 to the electrode pad 7 electrically, the insulating layer 2 on a through-hole bottom portion 11 is removed by etching. This allows the electrode pad 7 to be exposed at the bottom of the through-hole 12. As a method of removing the insulating layer 2 by etching, for example, a mask 13 for parylene bottom etching adjusted to the opening shape of the through-hole 12 is formed using a dry film resist to remove the insulating layer 2 by etching. As the material for the mask 13, a metal film such as Ti may be evaporated, or a dry film resist may be used. After the insulating layer 2 is removed by etching, the mask 13 is removed.

A conductive layer is formed at the inner portion of the through-hole and on the electrode pad exposed at the bottom portion of the through-hole, whereby the front and back surfaces of the semiconductor substrate are connected to each other electrically. Hereinafter, one embodiment of the step of forming a conductive layer is described. In this case, a conductive layer made of a first metal layer, a second metal layer, a first plating later, a plating suppression layer, and a second plating layer are described. However, the first and second metal layers may be one layer as long as the one layer can cause the insulating layer to adhere to the plating layer and function as a seed layer of the plating layer.

(Step of Forming a First Metal Layer)

Figure 6:
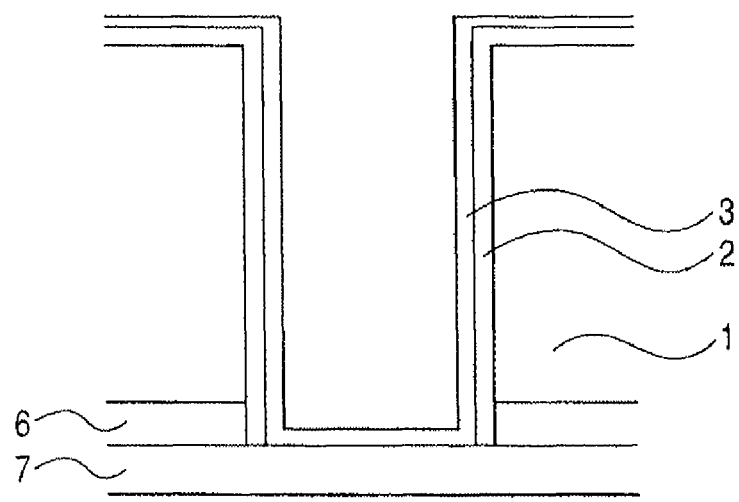
FIG. 6 is a schematic cross-sectional view illustrating the method of forming a conductive layer according to the first embodiment of the present invention.

Next, as illustrated in FIG. 6, a first metal layer 3 is formed. The first metal layer 3 has a role as an adhesive layer. For example, the adhesion of an inorganic material with respect to the insulating layer 2 made of parylene is poor, and for example, Au is particularly likely to peel. Therefore, as the first metal layer 3, for example, a Ti layer is formed, and a metal layer made of, for example, Au is formed thereon. The first metal layer 3 functions as an adhesive layer for the insulating layer 2 and the metal layer made of, for example, Au. Furthermore, the first metal layer 3 has a role as a barrier layer as well as the adhesive layer. The bottom of the through-hole 12 is the electrode pad 7, and corrosion occurs if a metal layer made of, for example, Au is formed directly on the electrode pad 7. In order to prevent the corrosion, the first metal layer 3 is also formed on the bottom portion of the through-hole 12, and the first metal layer 3 is formed as the barrier layer between the electrode pad 7 and the metal layer made of, for example, Au. In the following, the method of forming the first metal layer 3 is described. If the substrate has no constraint on a process temperature, the first metal layer 3 can be evaporated on an inner portion of the through-hole 12 by a method such as CVD or sputtering.

In the case where there is a process temperature constraint, and CVD or sputtering in which the temperature rises to 300° C. 400° C. cannot be used due to the characteristics of other used members formed on the semiconductor substrate 1, an evaporation method called ion plating, can be used. According to the ion plating, a crucible of metal to be evaporated is heated with an electron beam while the substrate to be treated is being cooled in vacuum, and a high-frequency plasma and a bias are applied, with the result that progressive low-temperature evaporation can be performed. The metal to be evaporated is allowed to be incident perpendicularly to be evaporated to the bottom portion of the through-hole by placing the substrate horizontally, and the metal to be evaporated is evaporated to the side wall of the through-hole by rotating the substrate so as to tilt the substrate. Using these methods, the first metal layer 3 is evaporated to 2000 Å, for example. As the first metal layer 3, metal such as titanium, chromium, tungsten, titanium tungsten (TiW), titanium nitride (TiN), or tantalum nitride (TaN) can be used.

Figure 7:
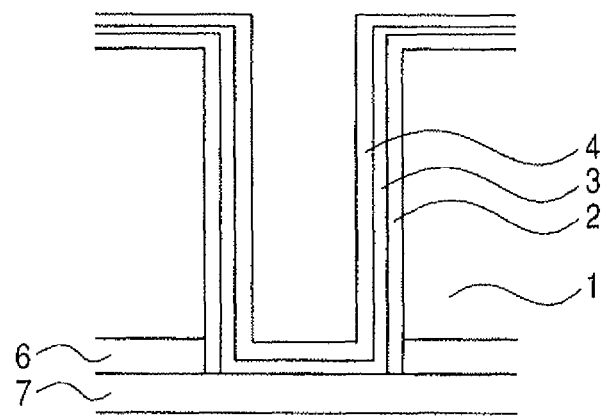
FIG. 7 is a schematic cross-sectional view illustrating the method of forming a conductive layer according to the first embodiment of the present invention.

(Step of Forming a Second Metal Layer)

in the case where the first metal layer 3 is made of, for example, Ti, the first metal layer 3 is highly resistant electrically even in an elemental form, and has a higher resistance when oxidized in an atmosphere, with the result that a plating layer (for example, Au plating) does not adhere thereto. Therefore, in the same way as in the first metal layer 3, a second metal layer 4 (for example, a layer made of Au) is evaporated. For example, the second metal layer 4 may be evaporated in a thickness of about 4200 Å. FIG. 7 illustrates a state thereof. The first metal layer 3 or the second metal layer 4 has a role of a plating seed layer for forming by plating a metal layer made of, for example, Au on the inner portion of the through-hole 12.

(First Plating Step)

Figure 8:
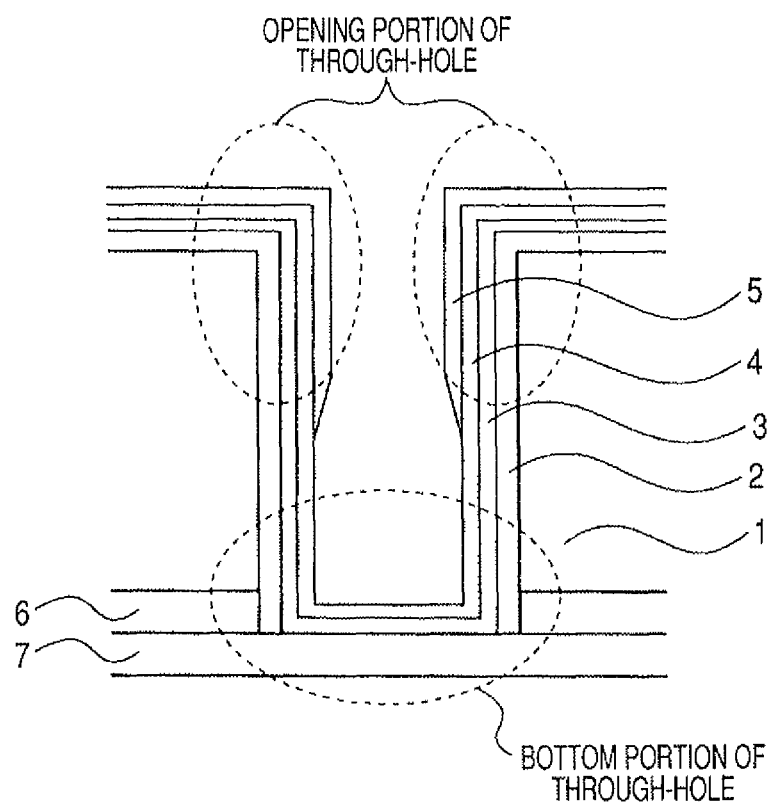
FIG. 8 a schematic cross-sectional view illustrating the method of forming a conductive layer according to the first embodiment of the present invention.

Next, as illustrated in FIG. 8, using the first metal layer formed in the step of forming a first metal layer as a seed, a first plating layer 5 is formed by plating.

The plating growth of the first plating layer 5 is fast in the vicinity of the opening of the through-hole 12 and the plating growth is slow on the bottom portion of the through-hole. This phenomenon appears particularly remarkably in a through-hole having a large aspect ratio (hole depth/opening diameter). It is clarified from the conventional conductive layer film thickness and theoretical value that an electric resistance is sufficient if the plating film thickness is 0.1 μm. Therefore, plating is suspended when the first plating layer 5 with a thickness of about 1 μm in the opening is obtained.

(Step of Forming a Plating Suppression Layer)

Figure 9:
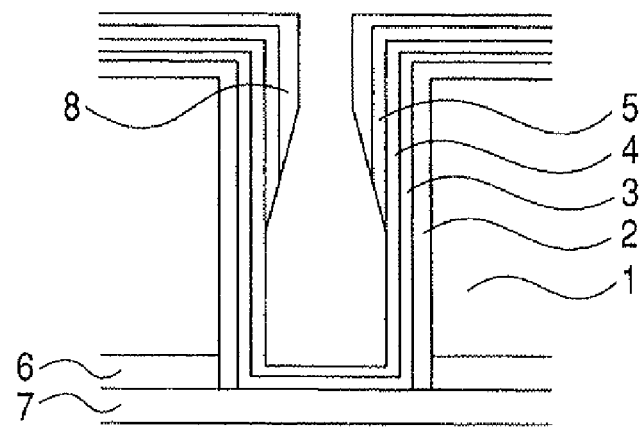
FIG. 9 is a schematic cross-sectional view illustrating the method of forming a conductive layer according to the first embodiment of the present invention.

Next, as illustrated in FIG. 9, a plating suppression layer 8 with an electric conductivity lower than that of the first plating layer 5 is formed on the first plating layer 5 in the opening portion such that the plating is not performed excessively. The plating suppression layer 8 can be formed by the same method as those of the first metal layer 1 and the second metal layer 4. For example, an evaporation method called ion plating can be used. According to the ion plating, a crucible of metal to be evaporated is heated with an electron beam while the substrate to be treated is being cooled in vacuum, and a high-frequency plasma and a bias are applied, with the result that progressive low-temperature evaporation can be performed. The evaporation is performed while rotating the semiconductor substrate 1 to tilt the semiconductor substrate 1 and adjusting the tilt angle so that a part of the first plating layer 5 is exposed, with the result that the first plating layer 5 can be connected physically and electrically to a second plating layer 9 to be formed next. A part of the first plating layer 5 only needs to be exposed at the inner portion of the through-hole by 2 μm or more, preferably 5 μm or more at which plating can be continued. When the exposure size is less than 2 μm, it becomes difficult to electrically connect the first plating layer 5 and the second plating layer 9 to be formed next. That is, electricity is difficult to flow to the conductive layer, and the function as a through-electrode is lost. A material having an electric conductivity lower than that of the first plating layer can be used for the plating suppression layer 8. For example, metal such as Ti, Cr, Ni, or W can be used. Furthermore, a resin material or the like may be used. In the case of using titanium, the surface of Ti is oxidized in the atmosphere, and has a higher electric resistance. Therefore, the second plating layer 9 to be formed next becomes difficult to adhere.

(Second Plating Step)

Figure 10:
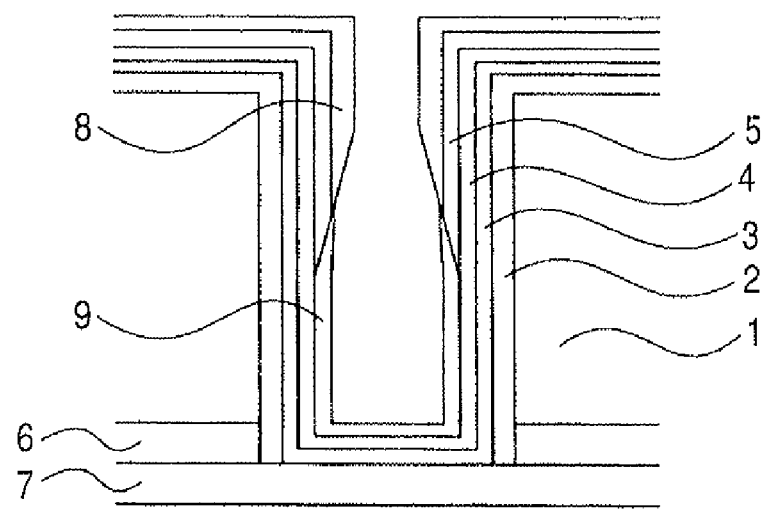
FIG. 10 is a schematic cross-sectional view illustrating the method of forming a conductive layer according to the first embodiment of the present invention.

Next, as illustrated in FIG. 10, the second plating layer 9 is formed by plating. By forming the plating suppression layer 8, plating is hardly performed on the plating suppression layer 8, and dating can be performed efficiently on the bottom portion of the through-hole 12. The process of forming a conductive layer is completed with a plating thickness of about 1 μm obtained also on the bottom portion of the through-hole.

Next, a semiconductor device of the present invention including a through-electrode formed in the above-mentioned method of forming a conductive layer is described with reference to the drawings.

Figure 1:
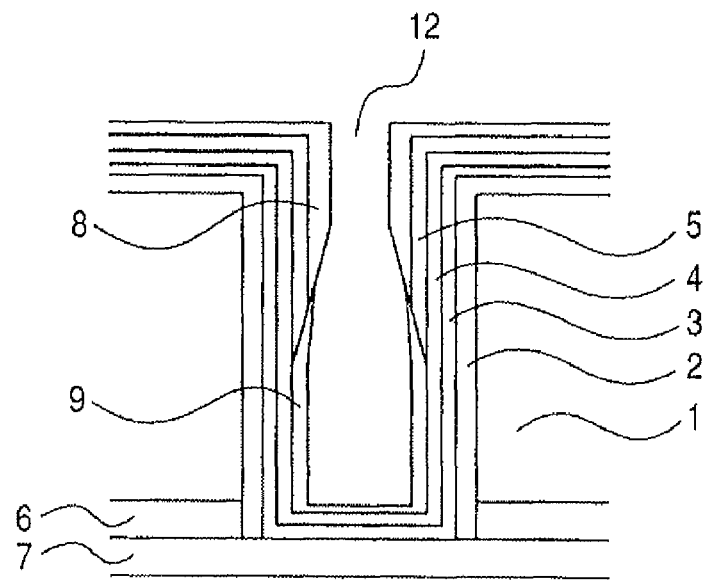
FIG. 1 is a schematic cross-sectional view illustrating a semiconductor device according to a first embodiment of the present invention.

FIG. 1 is a cross-sectional view illustrating the semiconductor device according to one embodiment of the present invention. The through-hole 12 of the through-electrode is formed in the semiconductor device of the present invention. On the surface of the semiconductor substrate 1 (surface of the silicon thermal oxide film 6 in the case where the silicon thermal oxide film 6 is formed on the semiconductor device 1), the electrode pad 7 formed on the surface of the semiconductor substrate is provided. The thickness of the semiconductor substrate 1 is for example, 200 μm. Furthermore, the electrode pad may be connected to a semiconductor element (not shown), wiring (not shown) or the like. The thickness of the electrode pad is, for example, 2.1 μm, and the thickness of the wiring is, for example, 0.6 μm. At a position corresponding to the electrode pad 7, the through-hole 12 of, for example, Φ50 μm is formed in the semiconductor substrate 1. The aspect ratio of the through-hole 12 is, for example, about 4. The insulating layer 2 is formed on the inner portion of the through-hole 12 excluding a part of the bottom portion of the through-hole 12 and on the back surface of the semiconductor substrate 1. As the insulating layer 2, an organic insulating film formed by, for example, parylene film formation may be used. The parylene film thickness may be about 1 μm to 3 μm. As the insulating layer, in addition to parylene, various kinds of resins such as a polyimide resin, a maleimide resin, a polyamide resin, a polyimideamide resin, a polyester resin, a polyether resin, a bisphenol resin, a modified epoxy resin, a modified acrylic resin, a silicon resin, a fluororesin, and a melamine resin, or a resin obtained by combining those resins appropriately can be used. A conductive layer is formed on the insulating layer 2. The conductive layer is made of, for example, the first metal layer 3, the second metal layer 4, the first plating later 5, the plating suppression layer 8, and the second plating layer 9. The first metal layer 3 and the second metal layer 4 do not need to be formed as two layers, and one layer may be formed as long as the one layer can cause the insulating layer to adhere to the plating layer and function as a seed layer of the plating layer. On the insulating layer 2, the first metal layer 3 is formed. The first metal layer 3 is made of metal such as titanium, chromium, tungsten, titanium tungsten (TiW), titanium nitride (TiN), or tantalum nitride (TaN). The second metal layer 4 made of Au or the like is formed on the first metal layer 3, and the first plating layer 5 made of Au or the like is formed on the second metal layer 4. The plating suppression layer 8 is formed on the first plating layer 5 in the opening portion of the through-hole. As the plating suppression layer 8, a material having an electric conductivity lower than that of the first plating layer 5 is used. A part of the first plating layer 5 is formed to the inner portion of the through-hole by 2 µm or more, preferably 5 µm or more from the end of the plating suppression layer 8. When the exposure size is less than 2 µm, it becomes difficult to electrically connect the first plating layer 5 and the second plating layer 9. That is, electricity is difficult to flow to the conductive layer. The second plating layer 9 is formed on the inner portion of the through-hole so as to overlap the exposed first plating layer 5. For example, metal such as Ti, Cr, Ni, or W can be used. Furthermore, a resin material or the like may be used. In the case of using titanium, the surface of Ti is oxidized in the atmosphere, and has a higher electric resistance. Therefore, the second plating layer 9 to be formed next becomes difficult to adhere. The first plating layer 5 and the second plating layer 9 are formed of metal such as gold. The first plating layer 5 and the second plating layer 9, may be formed of the same metal or different metals. The first plating layer 5 and the second plating layer 9 may be formed of the same metal because the electric conductivity thereof is equal, which facilitates the flow of electricity. The film thickness of each of the first plating layer 5 and the second plating layer 9 may be 1 µm or more. Furthermore, the conductive layer and the electrode pad 7 are in contact with each other at the bottom portion of the through-hole. That is, the conductive layer is electrically connected to the electrode pad 7 exposed ac the bottom portion of the through-hole 12. Bumps and the like (not shown) may be formed, if required, on the back surface of the semiconductor substrate.

Second Embodiment

Figure 11:
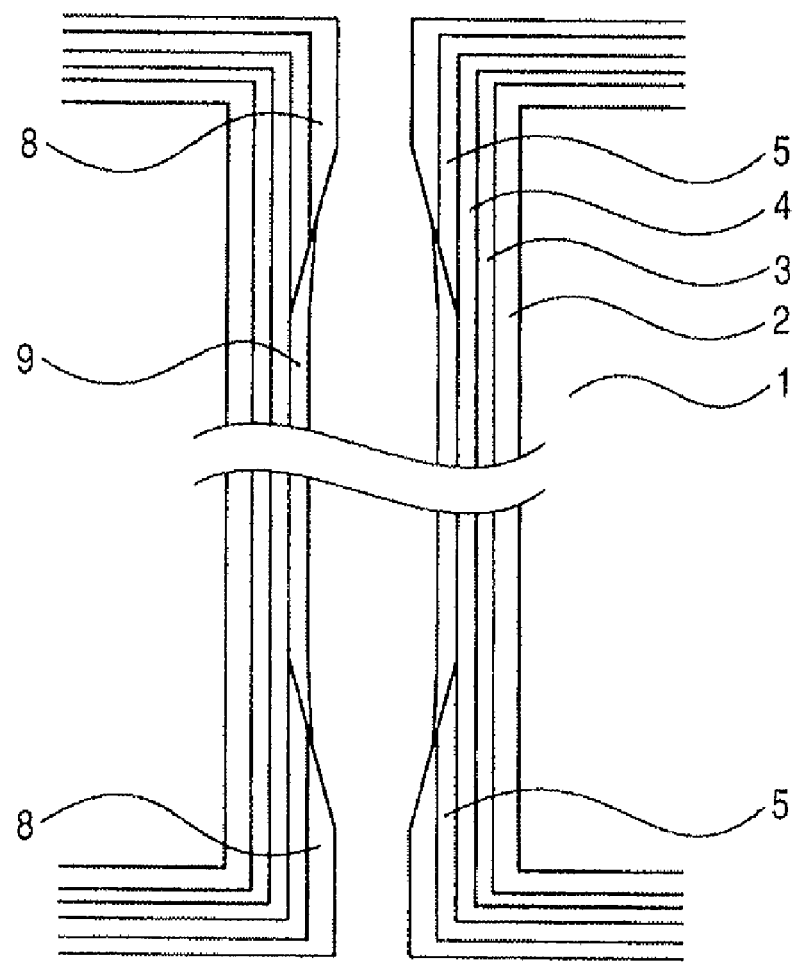
FIG. 11 is a schematic cross-sectional view illustrating a semiconductor device according to a second embodiment of the present invention.

FIG. 11 is a schematic cross-sectional view illustrating a semiconductor device according to a second embodiment of the present invention, in which a conductive layer is formed on the semiconductor substrate 1 having openings on both sides of the through-hole 12. In the semiconductor device illustrated in FIG. 1, an electrode pad is placed on the surface of the through-hole and the electrode pad and the conductive layer are connected to each other, with the result that the front and back surfaces of the semiconductor substrate are connected electrically in this embodiment, the conductive layer is formed from the back surface to the front surface, and the front and back surfaces are connected electrically via the conductive layer.

Third Embodiment

A third embodiment using a resin material for the plating suppression layer 8 is described. After the first plating layer 5 is formed, a dry film resist is laminated. The lamination is performed such that the dry film is attached to the surface of the substrate while heat and a pressure are applied, and the dry film is also embedded into the through-hole. After the dry film is embedded, an exposure mask is formed so as to be exposed by about 1 µm on the through-hole wall side, and the dry film resist is cured by exposure, to thereby form the plating suppression layer 8 made of a resin material. Consequently, the plating suppression layer 8 can be formed without using the evaporation step, and hence, plating can be suppressed more easily. This embodiment can be applied optimally to a through-hole having a relatively large opening diameter because a dry film resist filling the through-hole is used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-333866, filed Dec. 26, 2008, which is hereby incorporated by reference herein in its entirety.

What is claimed is:

1. A method of forming a conductive layer on an inner portion of a through-hole which penetrates a substrate, comprising:
   a step of forming a through-hole which penetrates a substrate;
   a first plating step of forming a first plating layer on an inner portion of the through-hole;
   a plating suppression layer forming step of forming a plating suppression layer having an electric conductivity lower than an electric conductivity of the first plating layer at a part on the first plating layer after the first plating step; and
   a second plating step of forming a second plating layer by plating on the inner portion of the through-hole after the plating suppression layer forming step.

2. The method of forming a conductive layer according to claim 1, wherein the plating suppression layer forming step is performed using CVD, sputtering, or ion plating while tilting and rotating the substrate.

3. The method of forming a conductive layer according to claim 1, wherein the first plating layer and the second plating layer comprise the same material.

4. The method of forming a conductive layer according to claim 1, wherein the first plating layer comprises Au.

5. The method of forming a conductive layer according to claim 1, wherein the second plating layer comprises Au.

6. The method of forming a conductive layer according to claim 1, wherein the plating suppression layer comprises Ti, Cr, Ni, W, or a resin material.

7. The method of forming a conductive layer according to claim 1, further comprising, after the step of forming a through-hole and before the first plating step, the step of forming an insulating layer and the step of forming a metal layer.

8. The method of forming a conductive layer according to claim 7, wherein the insulating layer comprises at least one selected from parylene, a polyimide resin, a maleimide resin, a polyamide resin, a polyimideamide resin, a polyester resin, a polyether resin, a bisphenol resin, a modified epoxy resin, a modified acrylic resin, a silicone resin, a fluororesin, and a melamine resin.

9. The method of forming a conductive layer according to claim 7, wherein the metal layer has a layer comprising titanium, chromium, tungsten, titanium tungsten, titanium nitride, or tantalum nitride and a layer comprising Au.

* * * * *